(12) United States Patent
DeBaets

(10) Patent No.: US 8,373,252 B1
(45) Date of Patent: Feb. 12, 2013

(54) INTEGRATED CIRCUIT HAVING CAPACITOR ON BACK SURFACE

(75) Inventor: Andrew J. DeBaets, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 44 days.

(21) Appl. No.: 13/042,132

(22) Filed: Mar. 7, 2011

(51) Int. Cl.
*H01L 21/02* (2006.01)

(52) U.S. Cl. .............................. 257/532; 257/E27.048

(58) Field of Classification Search .................. 257/516, 257/532, 520, 502, 503, 508, 307, 309, 71, 257/758, 68, 296, E27.016–E27.048, E21.008, 257/E21.648, E21.649, E21.653
See application file for complete search history.

(56) References Cited

U.S. PATENT DOCUMENTS

| | | | |
|---|---|---|---|
| 5,811,868 A * | 9/1998 | Bertin et al. .................. | 257/516 |
| 7,327,030 B2 | 2/2008 | Lam | |
| 7,355,273 B2 | 4/2008 | Jackson et al. | |
| 7,605,458 B1 | 10/2009 | Rahman et al. | |
| 2005/0017333 A1* | 1/2005 | Bohr ............................. | 257/678 |
| 2007/0194876 A1* | 8/2007 | Lim et al. ...................... | 336/223 |
| 2007/0205486 A1* | 9/2007 | Shioga et al. ................. | 257/532 |
| 2010/0308435 A1* | 12/2010 | Nowak et al. ................. | 257/532 |
| 2011/0115097 A1* | 5/2011 | Shau ............................. | 257/774 |
| 2012/0176751 A1* | 7/2012 | Sakai et al. ................... | 361/746 |
| 2012/0181658 A1* | 7/2012 | Mohammed et al. ......... | 257/532 |

OTHER PUBLICATIONS

U.S. Appl. No. 12/949,518, filed Nov. 18, 2010,, Mayder et al.

* cited by examiner

*Primary Examiner* — Ha Tran T Nguyen
*Assistant Examiner* — Vongsavanh Sengdara
(74) *Attorney, Agent, or Firm* — LeRoy D. Maunu; Lois D. Cartier

(57) ABSTRACT

An integrated circuit with capacitor structures includes a substrate and a plurality of vias extending from a front surface to a back surface of the substrate. A plurality of transistors is disposed at the front surface of the substrate and has first and second pluralities of electrodes. A patterned metal layer on the front surface of the semiconductor substrate provides first and second networks. The first network couples the first plurality of electrodes to a first via, and the second network couples the second plurality of electrodes to a second via. A dielectric layer separates first and second patterned metal layers on the back surface of the substrate. The first patterned metal layer includes a first metal plate coupled to the first via, and the second patterned metal layer includes a second metal plate coupled to the second via, forming a capacitor with the dielectric layer.

20 Claims, 4 Drawing Sheets

INTEGRATED CIRCUIT HAVING CAPACITOR ON BACK SURFACE

FIELD OF THE INVENTION

One or more embodiments generally relate to integrated circuits, and more particularly to capacitor structures in integrated circuits.

BACKGROUND

Systems built from integrated circuits generally include capacitors, such as decoupling capacitors between a power supply and ground. A decoupling capacitor provides a low impedance path that helps keep the voltage between the power supply and ground at its nominal voltage despite rapidly varying load demands.

Signals within and outside integrated circuits are frequently referenced to a power plane or a ground plane, and a driven signal induces a corresponding return signal in the nearby portions of the reference plane. A via can change the reference plane for a signal. In one example, the top two layers of a printed circuit board are an upper signal layer on an inner power plane and the bottom two layers of the printed circuit board are a lower signal layer on an inner ground plane, and a via transfers the signal from the upper signal layer to the lower signal layer. This via changes the signal's reference plane from the power plane to the ground plane. When a signal has a via that changes the reference plane, the induced return signal must switch reference planes. A decoupling capacitor between two reference planes provides a low impedance path for high-frequency components of the induced return signal to switch between the two reference planes.

Ignoring the effects of parasitic inductance, at all frequencies a large decoupling capacitance has a lower impedance than a small decoupling capacitance. However, a large decoupling capacitance generally requires a physically larger capacitor and longer wires to connect a load circuit to the physically larger decoupling capacitor. These longer wires produce parasitic inductance that limits the usefulness of a large decoupling capacitor.

A decoupling capacitor's capacitance and in-circuit parasitic inductance define a resonant frequency. A decoupling capacitor is often most effective near its resonant frequency, because both the capacitance and the parasitic inductance have a low impedance near the resonant frequency. Above the resonant frequency, the parasitic inductance produces a high impedance that limits the effectiveness of the decoupling capacitor. Below the resonant frequency, the capacitance of the decoupling capacitor produces a high impedance in comparison with a larger decoupling capacitor. Thus, in systems producing power supply noise over a wide frequency range, cost-effective power supply decoupling generally uses a range of sizes of decoupling capacitors.

The wiring between a decoupling capacitor and its load circuit forms a loop of a one-turn inductor, and the cross-sectional area of the loop roughly gives the parasitic inductance of the loop. Keeping the outgoing and incoming sides of the loop close together reduces the parasitic inductance, but the distance between the decoupling capacitor and its load circuit ultimately provides a lower bound on the parasitic inductance. Thus, the decoupling capacitors for bypassing high-frequency noise should be close to the load circuit that generates the high-frequency noise.

It is especially difficult to filter high-frequency noise created by the output circuits of an integrated circuit. These output circuits typically drive loads through wiring on a printed circuit board. Such remote loads have their own current loop producing parasitic inductance that is generally much greater than the parasitic inductance of loops confined within internal circuits of the integrated circuit. Moreover, in many integrated circuits, the input/output circuits drive remote loads at a higher switching rate than the bulk of the internal circuits of the integrated circuit. Thus, the input/output circuits of many integrated circuits have both a higher parasitic inductance and a higher generated noise frequency than the internal circuits of these integrated circuits. This makes effective decoupling capacitors especially difficult for the output circuits of many integrated circuits.

For high-frequency input signals, it is especially difficult to provide a low impedance path to allow the induced return signal to change reference planes between a power plane and a ground plane. A decoupling capacitor provides this function, but may typically be located on the package substrate or on the printed circuit board where the loop area between the input transistors and the decoupling capacitor creates a large, undesired, inductive parasitic element that limits high-frequency signal integrity.

SUMMARY

In one embodiment, an integrated circuit includes a semiconductor substrate having a front surface and a back surface. A plurality of through-semiconductor vias extends from the front surface to the back surface. The plurality of through-semiconductor vias includes a first via and a second via. A plurality of transistors is disposed at the front surface of the semiconductor substrate. The plurality of transistors has a first plurality of electrodes and a second plurality of electrodes. At least one patterned metal layer is disposed on the front surface of the semiconductor substrate. The patterned metal layer provides a first network and a second network. The first network couples the first plurality of electrodes to the first via, and the second network couples the second plurality of electrodes to the second via. A first and a second patterned metal layer are disposed on the back surface of the semiconductor substrate and are separated by a dielectric layer. The first patterned metal layer includes a first metal plate coupled to the first via, and the second patterned metal layer includes a second metal plate coupled to the second via. A decoupling capacitor includes the first and second metal plates separated by the dielectric layer.

In another embodiment, an integrated circuit includes a semiconductor substrate having a front surface and a back surface. A plurality of through-semiconductor vias extends from the front surface to the back surface. A plurality of transistors is disposed at the front surface of the semiconductor substrate and is arranged in a plurality of banks. The plurality of transistors has a respective first plurality of electrodes for each bank and a respective second plurality of electrodes for each bank. The plurality of through-semiconductor vias includes a respective first via for each bank and a respective second via for each bank. At least one patterned metal layer is disposed on the front surface of the semiconductor substrate. The patterned metal layer provides a respective first network for each bank and a respective second network for each bank. The respective first network for each bank couples the respective first plurality of electrodes for the bank to the respective first via for the bank. The respective second network for each bank couples the respective second plurality of electrodes for the bank to the respective second via for the bank. A first and a second patterned metal layer are disposed on the back surface of the semiconductor substrate and are separated by a dielectric layer. The first patterned metal layer includes a respective first metal plate for each bank coupled to the respective first via for the bank, and the second patterned metal layer includes a respective second metal plate for each bank coupled to the respective second via for the bank. A capacitor for each bank includes the respective first metal plate and the respective second metal plate separated by the dielectric layer.

A method of fabricating an integrated circuit is provided in another embodiment. The method includes fabricating a plurality of through-semiconductor vias between a front surface of a semiconductor substrate and a back surface of the semiconductor substrate. The plurality of through-semiconductor vias includes, for each of a plurality of banks, a respective first via and a respective second via. A plurality of transistors is fabricated in the plurality of banks on the front surface of the semiconductor substrate. The plurality of transistors has, for each bank, a respective first plurality of electrodes and a respective second plurality of electrodes. At least one metal layer is deposited and patterned on the front surface of the semiconductor substrate. The metal layer provides, for each bank, a respective first network and a respective second network. For each bank, the respective first network couples the respective first plurality of electrodes to the respective first via, and the respective second network couples the respective second plurality of electrodes to the respective second via. First and second metal layers are deposited and patterned on the back surface of the semiconductor substrate. For each bank, the first metal layer includes a respective first metal plate coupled to the respective first via and the second metal layer includes a respective second metal plate coupled to the respective second via. A decoupling capacitor for each bank includes the respective first metal plate and the respective second metal plate.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which:

FIGS. 3-1, 3-2, and 3-3 are plan and cross-sectional views of an integrated circuit including capacitors.

DETAILED DESCRIPTION

Figure 1:
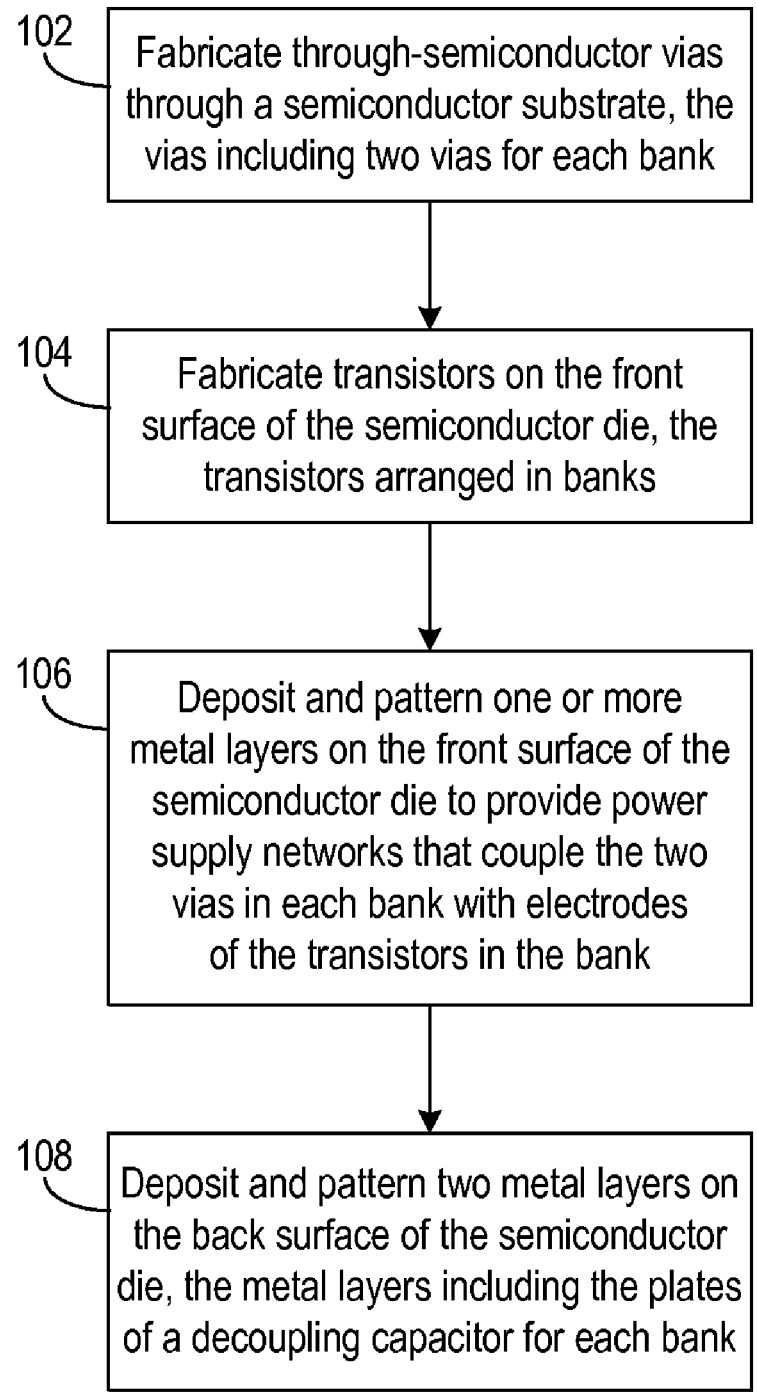
FIG. 1 is a flow diagram of a process for fabricating an integrated circuit including decoupling capacitors.

FIG. 1 is a flow diagram of a process for fabricating an integrated circuit including decoupling capacitors. The decoupling capacitors are fabricated on the back surface of the integrated circuit, and the decoupling capacitors are connected to circuitry on the front surface of the integrated circuit using through-semiconductor vias (TSVs). The integrated circuit has transistors disposed on the front surface and does not have any transistors disposed on the back surface.

At block 102, TSVs are fabricated between a front surface of a semiconductor substrate and a back surface of the semiconductor substrate. Those skilled in the art of fabrication of integrated circuits will understand the fabrication of TSVs. For example, reference may be made to U.S. Pat. No. 7,355,273, which discusses techniques and equipment for fabricating TSVs.

At block 104, multiple banks of transistors are fabricated on the front surface of the semiconductor substrate. The fabricated transistors have first electrodes for each bank and second electrodes for each bank. The TSVs fabricated at block 102 include a first TSV for each bank and a second TSV for each bank.

At block 106, one or more metal layers are deposited and patterned on the front surface of the semiconductor substrate. These metal layers provide a first network for each bank and a second network for each bank. The first network for each bank couples the first electrodes for the bank and the first TSV for the bank, and the second network for each bank couples the second electrodes for the bank and the second TSV for the bank. In one embodiment, the first networks for all of the banks are configured to be coupled to a ground voltage, and the second networks are configured to be coupled to different power supply voltages.

At block 108, a first and second metal layer are deposited and patterned on the back surface of the semiconductor substrate. The first metal layer includes a first metal plate for each bank and the second metal layer includes a second metal plate for each bank. A decoupling capacitor for each bank includes the first and second metal plates for the bank, and the first and second metal plates for each bank are respectively coupled to the first and second TSV for the bank.

Because the decoupling capacitor for a bank is merely a substrate thickness away from its bank of transistors, the parasitic inductance of the wiring between the decoupling capacitor and the transistors is very small, especially in comparison with the attainable capacitance of the decoupling capacitor. Because of the low parasitic capacitance and the high attainable capacitance, the decoupling capacitor provides a low impedance path over an extended range of frequencies. Thus, these integrated decoupling capacitors may dramatically reduce the number of different sizes of decoupling capacitors needed for each power supply of an electronic system.

Figure 2:
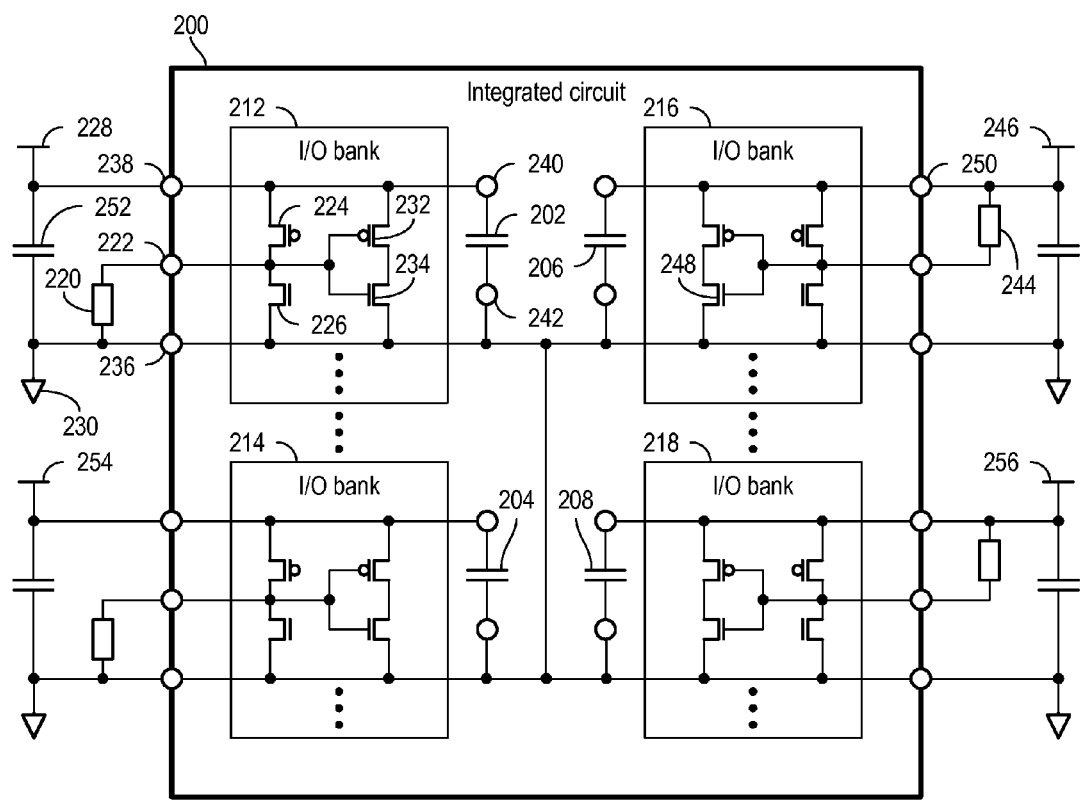
FIG. 2 is a circuit diagram illustrating an integrated circuit including decoupling capacitors.

FIG. 2 is a circuit diagram illustrating an integrated circuit 200 including decoupling capacitors 202, 204, 206, and 208. The integrated circuit 200 includes I/O banks 212, 214, 216, and 218, having integrated decoupling capacitors 202, 204, 206, and 208, respectively. The decoupling capacitors 202, 204, 206, and 208 on the back surface of the integrated circuit 200 are coupled to I/O banks 212, 214, 216, and 218 by TSVs. For example, TSVs 240 and 242 connect the decoupling capacitor 202 to the power and ground networks of I/O bank 212.

The I/O bank 212 drives a load 220 through an output signal pin 222, and receives from the load 220 through the output signal pin 222. The I/O bank 212 includes drive transistors 224 and 226 for driving the load 220 to the voltage of the power supply 228 and to ground 230, respectively. I/O bank 212 also includes receive transistors 232 and 234 for receiving from the load 220.

When the I/O bank 212 drives the output signal pin 222 from the voltage of the power supply 228 and to ground 230, drive transistor 224 switches off and drive transistor 226 switches on, and drive transistor 226 couples the charged capacitance of load 220 to the ground network. While drive transistor 226 is discharging the capacitance of load 220, the resulting current spike causes a voltage drop across the inductance of the ground network, such as the inductance of ground pin 236. A similar voltage drop occurs across the inductance of power supply pin 238 when I/O bank 212 drives the output signal pin 222 from ground 230 to the voltage of the power supply 228.

The decoupling capacitor 202 provides a low impedance path that maintains the power supply voltage between the power and ground networks in integrated circuit 200 despite the switching noise from I/O bank 212 driving load 220. Transistor 224 drives the output signal pin 222 to the voltage of the power supply 228 from both the power supply pin 238 and the decoupling capacitor 202 for I/O bank 212.

The load 220 is shown referenced to ground 230. When the load drives 220 a rising transition at output signal pin 222, current flows into output signal pin 222 to charge the capacitance of the gate electrodes of receive transistors 232 and 234. In one embodiment, the integrated circuit 200 includes a termination resistance (not shown) for output signal pin 222, and the rising transition increases the current flowing into output signal pin 222 and through the termination resistance. The current that load 220 drives through output signal pin 222 divides between transistors 232 and 234 and any internal termination resistance, and a portion of this driven current passes through the source electrode of transistor 232 into the internal power network. Because the load 220 is referenced to ground 230, the current driven into output signal pin 222 induces a matching return current at ground pin 236. Decoupling capacitor 202 provides a low impedance path from the power network to the ground network, and the portion of the current driven through transistor 232 reaches the return current induced at ground pin 236 via this low impedance path. Decoupling capacitor 202 similarly provides a low impedance path when the load 220 drives a falling transition at output signal pin 222.

In contrast, load 244 is shown referenced to power supply 246. Decoupling capacitor 206 provides a low impedance path from the ground network to the power network, and the current that load 244 drives through the source electrode of transistor 248 passes through this low impedance path to reach the return current induced at power supply pin 250.

While the decoupling capacitors 202, 204, 206, and 208 provide a low impedance path over an extended range of frequencies, their capacitances may be insufficient to decouple low frequencies. For example, I/O bank 212 may alternate between driving the voltage of the power supply 228 for several microseconds and driving ground 230 for several microseconds, and this may produce low-frequency switching noise. An external decoupling capacitor 252 or capacitors may provide sufficient capacitance to provide a low impedance path that filters such low-frequency switching noise.

In one embodiment, some or all of voltages are different for power supplies 228, 246, 254 and 256. This permits each I/O bank 212, 214, 216, and 218 to support different signaling standards. The power networks of I/O banks 212, 214, 216, and 218 are electrically isolated from each other, but the ground networks of I/O banks 212, 214, 216, and 218 are all electrically coupled to ground 230.

It will be appreciated that while the I/O banks 212, 214, 216, and 218 are shown with bidirectional drivers, the I/O banks 212, 214, 216, and 218 may include unidirectional output drivers and/or unidirectional input receivers. The decoupling capacitors 202, 204, 206, and 208 may provide a low impedance path for output switching noise from the unidirectional output drivers and a low impedance path for the return current from the unidirectional input receivers.

Figures 1, 3:
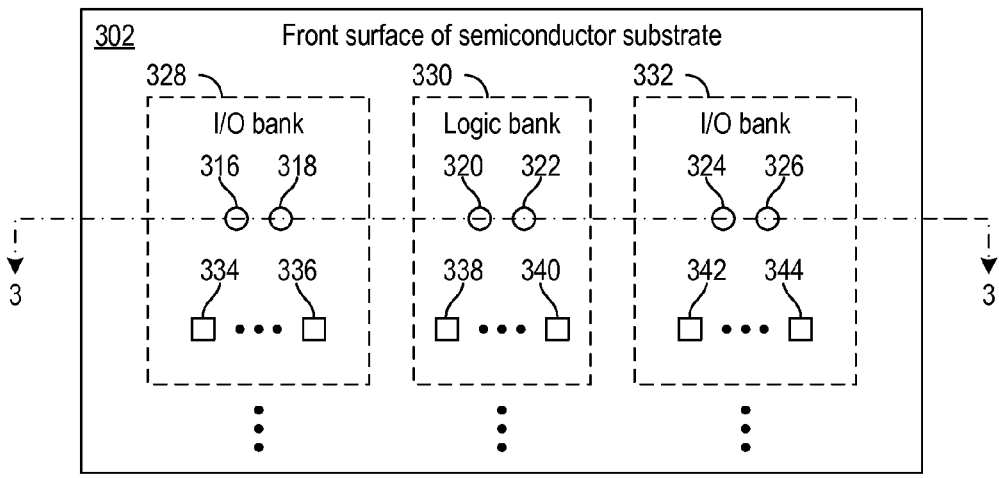
Figures 2, 3:
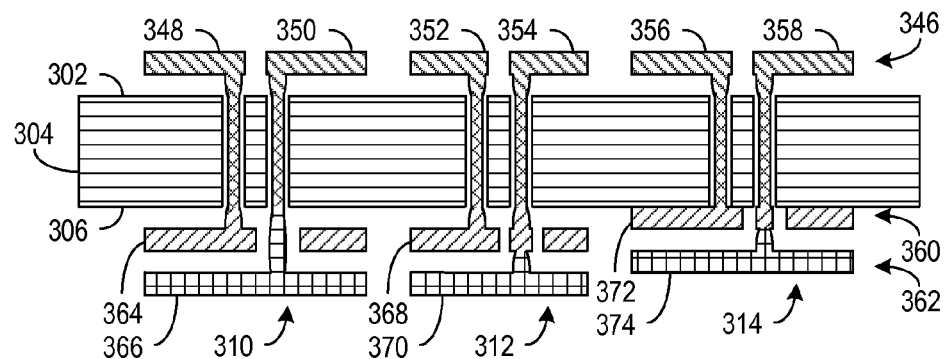
Figure 3:
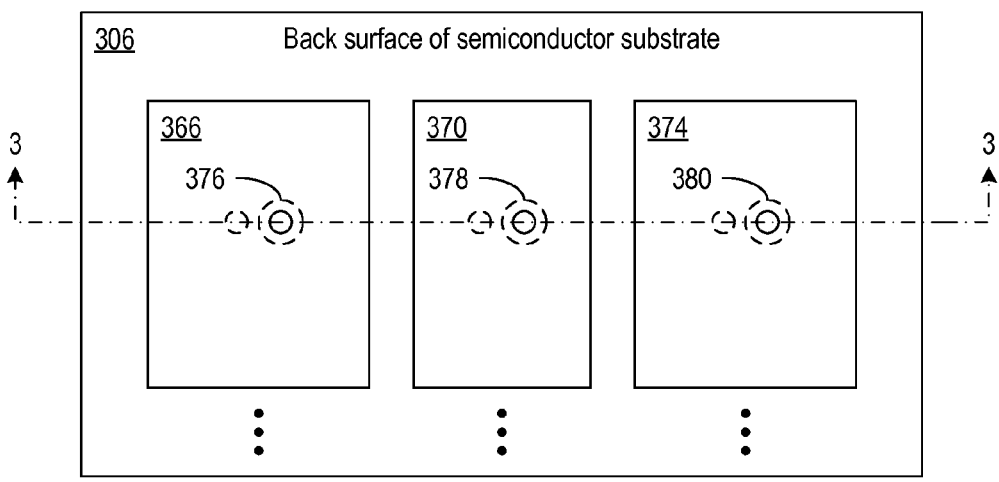

FIGS. 3-1, 3-2, and 3-3 are plan and cross-sectional views of an integrated circuit including capacitors. FIG. 3-1 is a plan view of the front surface 302 of the semiconductor substrate 304, and FIGS. 3-3 is a plan view of the back surface 306 of the semiconductor substrate 304. FIGS. 3-2 is a cross-sectional view along section line 3 of FIGS. 3-1 and 3-3, and FIGS. 3-2 illustrates the structure of capacitors 310, 312, and 314 on the back surface 306, in accordance with several embodiments.

Through-semiconductor vias (TSVs) 316, 318, 320, 322, 324, and 326 extend through the semiconductor substrate 304 from the front surface 302 to the back surface 306. The TSVs include a first TSV 316 and a second TSV 318 for I/O bank 328, a first TSV 320 and a second TSV 322 for logic bank 330, and a first TSV 324 and a second TSV 326 for I/O bank 332.

Transistors 334 through 336 are disposed at the front surface 302 of the semiconductor substrate 304 and arranged in I/O bank 328. Electrodes of transistors 334 through 336 are coupled to two networks. In one embodiment, certain transistor electrodes are coupled to a power supply network and certain transistor electrodes are coupled to a ground network. Similarly, logic bank 330 includes transistors 338 through 340, and I/O bank 332 includes transistors 342 through 344.

Patterned metal layer 346 is disposed on the front surface 302 of the semiconductor substrate 304. The patterned metal layer 346 provides two networks 348 and 350 for bank 328, two networks 352 and 354 for bank 330, and two networks 356 and 358 for bank 332. In one embodiment, network 348 is a ground network coupling TSV 316 to the ground electrodes of transistors 334 through 336 in bank 328, and network 350 is a power supply network coupling TSV 318 to the power supply electrodes of transistors 334 through 336. Similarly, networks 352 and 354 couple TSVs 320 and 322 to electrodes of transistors 338 through 340 of bank 330, and networks 356 and 358 couple TSVs 324 and 326 to electrodes of transistors 342 through 344 of bank 332.

Patterned metal layers 360 and 362 are disposed on the back surface 306 of the semiconductor substrate 304. The patterned metal layers 360 and 362 provide two metal plates 364 and 366 for bank 328, two metal plates 368 and 370 for bank 330, and two metal plates 372 and 374 for bank 332. Metal plate 364 is coupled to TSV 316 of bank 328, and metal plate 366 is coupled to TSV 318 of bank 328. Capacitor 310 for bank 328 includes the metal plates 364 and 366 separated by a dielectric layer (not shown for clarity). Similarly, metal plates 368 and 370 of capacitor 312 are coupled to TSVs 320 and 322 of bank 330, and metal plates 372 and 374 of capacitor 314 are coupled to TSVs 324 and 326 of bank 332.

In one embodiment, the patterned metal layer 360 includes a patterned layer of a degenerate semiconductor sufficiently doped to be a metallic conductor. The patterned layer of the degenerate semiconductor is electrically coupled to the back surface 306 of the semiconductor substrate 304 and to the first TSVs 316, 320, and 324 for each of banks 328, 330, and 332.

In another embodiment, the patterned metal layer 360 is a patterned aluminum layer, and aluminum plate 372 of patterned metal layer 360 directly adheres to the back surface 306 of the semiconductor substrate 304. Aluminum plate 372 is electrically coupled to both the back surface 306 and TSV 324. Patterned aluminum layer 360 adheres to the back surface 306, the dielectric layer adheres to patterned aluminum layer 360 and a portion of the back surface 306, and the patterned metal layer 362 is a patterned aluminum layer adhering to the dielectric layer. The dielectric layer between patterned metal layers 360 and 362 is silicon dioxide in one embodiment, and the dielectric layer is aluminum oxide in another embodiment.

In yet another embodiment, an additional dielectric layer (not shown for clarity) adheres to the back surface 306 of the semiconductor substrate 304. The patterned metal layer 360 is a patterned aluminum layer and aluminum plates 364 and 368 of patterned aluminum layer 360 adhere to the additional dielectric layer. The additional dielectric layer electrically insulates aluminum plates 364 and 368 from the semiconductor substrate 304.

The metal plate 366 connects directly to TSV 318 in one embodiment, and the metal plate 370 connects to TSV 322 through a contact area of the patterned metal layer 360 in another embodiment.

In one embodiment, the metal plate 366 has a rectangular shape as shown, and the metal plate 364 has the same rectangular shape with a clearance hole 376 for the second TSV 318 of bank 328. The rectangular shapes of metal plates 364 and 366 have a shared width and length. Similarly for banks 330 and 332, metal plate 368 has the rectangular shape of metal plate 370 with a clearance hole 378 for TSV 322, and metal plate 372 has the rectangular shape of metal plate 374 with a clearance hole 380 for TSV 326. In other embodiments (not shown), the metal plates have non-rectangular shapes.

In this embodiment, the transistors 334 through 336 of bank 328 and the electrodes of transistors 334 through 336 are disposed at the front surface 302 of the semiconductor substrate 304 within a rectangular shape matching the rectangular shape of the metal plates 364 and 366. Thus, the width and length of bank 328 matches the width and length of metal plates 364 and 366. A terminal of TSV 316 is the end of TSV 316 at the front surface 302, and a terminal of TSV 318 is the end of TSV 318 at the front surface 302. These terminals of TSVs 316 and 318 are also disposed at the front surface 302 of the semiconductor substrate 304 within the rectangular shape of bank 328. Similarly, banks 330 and 332 have transistors 338 through 340 and 342 through 334 and terminals of TSVs 320, 322, 324, and 326 that are disposed within the respective rectangular shapes of banks 330 and 332.

In addition, the rectangular shapes of metal plates 364 and 366 are coextensive in the two lateral dimensions of the plan views of FIGS. 3-1 and 3-3. Metal plates 368 and 370, and metal plates 372 and 374 are similarly coextensive in the two lateral dimensions. Furthermore, the rectangular shape of each bank 328, 330, and 332 is respectively coextensive in the two lateral dimensions with the metal plates 364 and 366, metal plates 368 and 370, and metal plates 372 and 374 of the respective capacitors 310, 312, and 314 for the bank.

In one embodiment, capacitor 310 for bank 328 produces a capacitance that is an area of metal plate 364 times a permittivity of the dielectric layer divided by a thickness of the dielectric layer. The area of metal plate 364 is the area of metal plate 366 minus an area of the clearance hole 376. The area of metal plate 366 is the width of the rectangular shape of metal plates 364 and 336 times the length of this rectangular shape. In addition, the area of metal plate 364 is the area of adherence between metal plate 364 and the back surface 306 of the semiconductor substrate 304. The capacitor 312 for bank 330 produces a corresponding capacitance and the capacitor 314 for bank 332 produces a corresponding capacitance.

Figure 4:
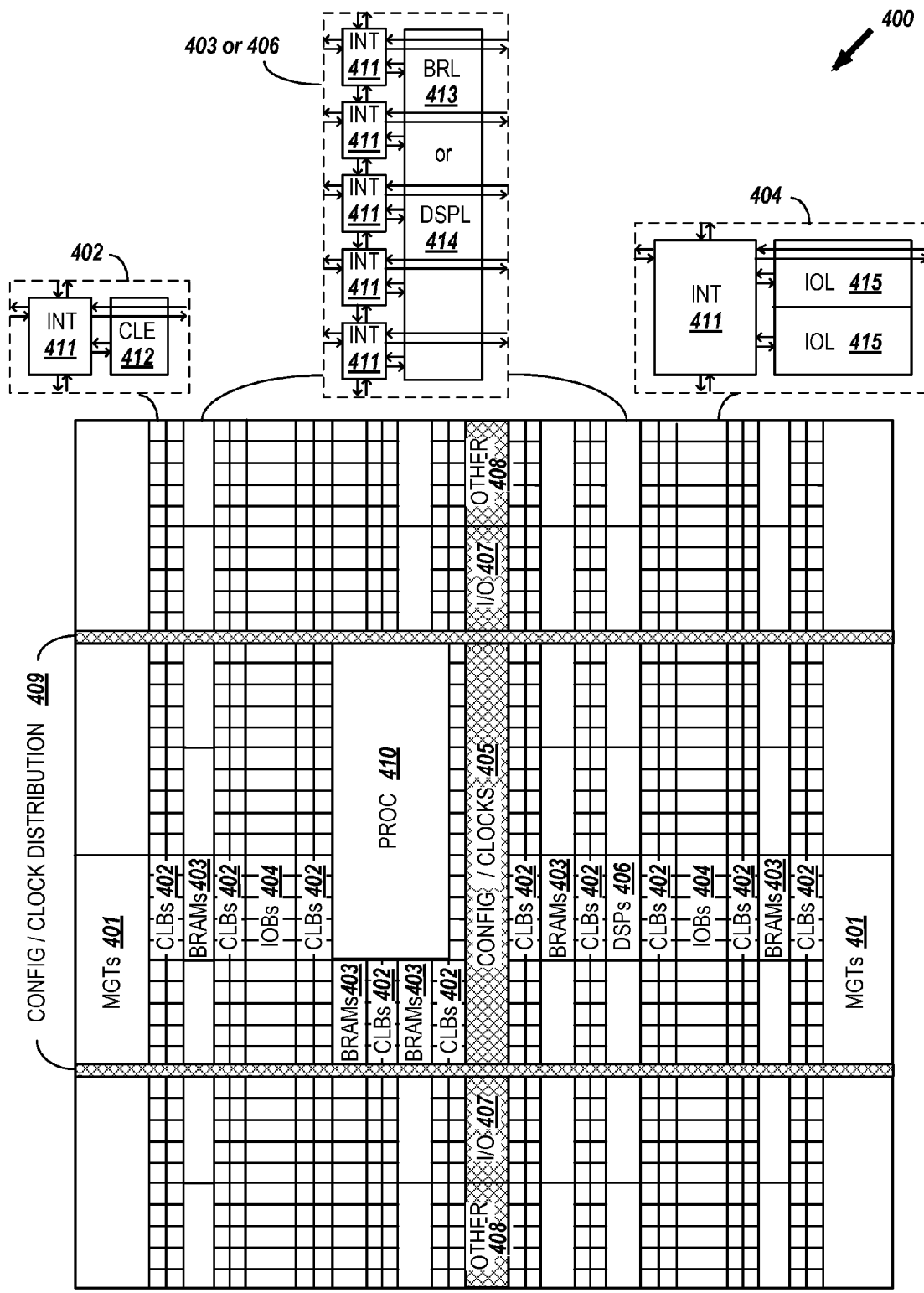
FIG. 4 is a block diagram of an example programmable integrated circuit including capacitors.

FIG. 4 is a block diagram of an example programmable integrated circuit including capacitors. FIG. 4 shows the front surface of the example programmable integrated circuit and the capacitors are disposed on the back surface of the programmable integrated circuit.

One type of programmable integrated circuit is a field-programmable gate array (FPGA) that includes several different types of programmable logic blocks in the array. For example, FIG. 4 illustrates an FPGA architecture (400) that includes a large number of different programmable tiles, including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407), for example, e.g., clock ports, and other programmable logic 408, such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL 414) in addition to an appropriate number of programmable interconnect elements. An 10B 404 can include, for example, two instances of an input/output logic element (IOL 415) in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410, shown in FIG. 4, spans several columns of CLBs and BRAMs.

In one embodiment, each column of MGTs 401 and each column of IOBs 404 form one or more I/O banks, and each I/O bank has a corresponding capacitor on the back surface that may be coextensive with the area of the I/O bank. The FPGA has a separate power network in each I/O bank to support concurrent use of different signaling standards in different I/O banks. The CLBs 402, BRAMs 403, and DSPs 406 usually form a single logic bank, because they share a power distribution grid.

It will be appreciated that certain banks may have multiple power network TSVs and multiple ground network TSVs. For a bank with a length significantly exceeding its width, multiple TSVs distributed along the length limit the inductance between the circuitry in each bank and the capacitor for the bank.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA, more than one adjacent column of CLBs is typically included wherever the CLBs appear, to facilitate the efficient implementation of user logic.

The embodiments are thought to be applicable to a variety of semiconductor structures and integrated circuits. Other aspects and embodiments will be apparent to those skilled in the art from consideration of the specification. It is intended that the specification and illustrated embodiments be considered as examples only, with a true scope and spirit of the invention being indicated by the following claims.

What is claimed is:

1. An integrated circuit, comprising:
   a semiconductor substrate having a front surface and a back surface;
   a plurality of through-semiconductor vias extending from the front surface to the back surface, the plurality of through-semiconductor vias including a first via and a second via;
   a plurality of transistors disposed at the front surface of the semiconductor substrate;
   wherein the plurality of transistors has a first plurality of electrodes and a second plurality of electrodes;
   at least one patterned metal layer disposed on the front surface of the semiconductor substrate, the at least one patterned metal layer providing a first network and a second network;
   wherein the first network couples the first plurality of electrodes to the first via, and the second network couples the second plurality of electrodes to the second via; and
   a first and second patterned metal layer disposed on the back surface of the semiconductor substrate and separated by a dielectric layer, the first patterned metal layer including a first metal plate coupled to the first via, and the second patterned metal layer including a second metal plate coupled to the second via;
   wherein a decoupling capacitor includes the first and second metal plates separated by the dielectric layer.

2. The integrated circuit of claim 1, wherein:
   the first patterned metal layer is a patterned aluminum layer adhering to the back surface of the semiconductor substrate; and
   the patterned aluminum layer is electrically coupled to the back surface of the semiconductor substrate and the first via.

3. The integrated circuit of claim 1, wherein:
   the dielectric layer is silicon dioxide;
   the first patterned metal layer is a patterned aluminum layer that adheres to the back surface of the semiconductor substrate;
   the dielectric layer adheres to the patterned aluminum layer and a portion of the back surface of the semiconductor substrate; and
   the second patterned metal layer is a patterned aluminum layer that adheres to the dielectric layer.

4. An integrated circuit, comprising:
   a semiconductor substrate having a front surface and a back surface;
   a plurality of through-semiconductor vias extending from the front surface to the back surface;
   a plurality of transistors disposed at the front surface of the semiconductor substrate and arranged in a plurality of banks;
   wherein the plurality of transistors has a respective first plurality of electrodes for each bank and a respective second plurality of electrodes for each bank, and the plurality of through-semiconductor vias includes a respective first via for each bank and a respective second via for each bank;
   at least one patterned metal layer disposed on the front surface of the semiconductor substrate, the at least one patterned metal layer providing a respective first network for each bank and a respective second network for each bank;
   wherein the respective first network for each bank couples the respective first plurality of electrodes for the bank to the respective first via for the bank, and the respective second network for each bank couples the respective second plurality of electrodes for the bank to the respective second via for the bank; and
   a first and second patterned metal layer disposed on the back surface of the semiconductor substrate and separated by a dielectric layer, the first patterned metal layer including a respective first metal plate for each bank coupled to the respective first via for the bank, and the second patterned metal layer including a respective second metal plate for each bank coupled to the respective second via for the bank;
   wherein a capacitor for each bank includes the respective first metal plate and the respective second metal plate separated by the dielectric layer.

5. The integrated circuit of claim 4, wherein:
   the first patterned metal layer includes a patterned layer of a degenerate semiconductor sufficiently doped to be a metallic conductor; and
   the patterned layer of the degenerate semiconductor is electrically coupled to the back surface of the semiconductor substrate and the respective first via for each bank.

6. The integrated circuit of claim 4, wherein:
   the first patterned metal layer is a patterned aluminum layer directly adhering to the back surface of the semiconductor substrate; and
   the patterned aluminum layer is electrically coupled to the back surface of the semiconductor substrate and to the respective first via for each bank.

7. The integrated circuit of claim 4, further comprising another dielectric layer adhering to the back surface of the semiconductor substrate, wherein:
   the first patterned metal layer is a patterned aluminum layer adhering to the another dielectric layer; and
   the another dielectric layer electrically insulates the patterned aluminum layer from the semiconductor substrate.

8. The integrated circuit of claim 4, wherein:
   the first patterned metal layer is a patterned aluminum layer that adheres to the back surface of the semiconductor substrate;
   the dielectric layer adheres to the patterned aluminum layer and a portion of the back surface of the semiconductor substrate; and
   the second patterned metal layer is a patterned aluminum layer that adheres to the dielectric layer.

9. The integrated circuit of claim 8, wherein the dielectric layer is a dielectric layer of silicon dioxide.

10. The integrated circuit of claim 8, wherein the dielectric layer is a dielectric layer of an aluminum oxide.

11. The integrated circuit of claim 4, wherein, for each of the plurality of banks:

the respective first metal plate has a first rectangular shape with a clearance hole for the respective second via;

the respective second metal plate has a second rectangular shape;

a width of the first rectangular shape is equal to a width of the second rectangular shape; and a length of the first rectangular shape is equal to a length of the second rectangular shape.

12. The integrated circuit of claim 11, wherein, for each bank of the plurality of banks:

the plurality of transistors in the bank and the respective first and second pluralities of electrodes are disposed within a third rectangular shape at the front surface of the semiconductor substrate;

a first terminal of the respective first via is an end of the respective first via disposed at the front surface, and a second terminal of the respective second via is an end of the respective second via disposed at the front surface;

the first and second terminals are disposed within the third rectangular shape at the front surface of the semiconductor substrate; and the third rectangular shape has a width and length equal to the width and length of the first rectangular shape, respectively.

13. The integrated circuit of claim 12, wherein the first, second, and third rectangular shapes are coextensive in two lateral dimensions of the integrated circuit.

14. The integrated circuit of claim 12, wherein:

a first area is equal to the width times the length minus an area of the clearance hole of the respective first metal plate; and the capacitor for each bank produces a capacitance that a function of the first area times a permittivity of the dielectric layer divided by a thickness of the dielectric layer.

15. The integrated circuit of claim 14, wherein the respective first metal plate of the capacitor for each bank adheres to the back surface of the semiconductor substrate over an area equaling the first area.

16. The integrated circuit of claim 4, wherein, for each bank of the plurality of banks:

the respective first metal plate and the respective second metal plate of the capacitor are coextensive in two lateral dimensions of the integrated circuit; and the bank and each of the respective first metal plate and the respective second metal plate of the capacitor are coextensive in the two lateral dimensions.

17. The integrated circuit of claim 4, wherein:

a first plurality of networks include the respective first network for each bank, and the first plurality of networks are electrically coupled and are configured to be coupled to a ground voltage; and a second plurality of networks include the respective second network for each bank, and the second plurality of networks are electrically isolated from each other and are configured to be respectively coupled to a plurality of different power supply voltages.

18. The integrated circuit of claim 17, further comprising a plurality of pins including a power supply pin for the first bank and an output signal pin for the first bank; wherein:

at least one of the plurality of transistors in the first bank drives the output signal pin with the first power supply voltage from the power supply pin and from the capacitor for the first bank; and the capacitor for the first bank is a decoupling capacitor for the first power supply voltage from the power supply pin.

19. A method of fabricating an integrated circuit, comprising:

fabricating a plurality of through-semiconductor vias between a front surface of a semiconductor substrate and a back surface of the semiconductor substrate;

wherein the plurality of through-semiconductor vias includes, for each of a plurality of banks, a respective first via and a respective second via;

fabricating a plurality of transistors arranged in the plurality of banks on the front surface of the semiconductor substrate;

wherein the plurality of transistors has, for each bank, a respective first plurality of electrodes and a respective second plurality of electrodes;

depositing and patterning at least one metal layer on the front surface of the semiconductor substrate, the at least one metal layer providing, for each bank, a respective first network and a respective second network;

wherein, for each bank, the respective first network couples the respective first plurality of electrodes to the respective first via, and the respective second network couples the respective second plurality of electrodes to the respective second via; and depositing and patterning a first and second metal layer on the back surface of the semiconductor substrate, and, for each bank, the first metal layer includes a respective first metal plate coupled to the respective first via and the second metal layer includes a respective second metal plate coupled to the respective second via, wherein a decoupling capacitor for each bank includes the respective first metal plate and the respective second metal plate.

20. The method of claim 19, wherein the depositing and the patterning of the at least one metal layer includes depositing and patterning the at least one metal layer providing, for each bank, the respective first network that is configured to be coupled to a ground voltage for all of the plurality of banks, and providing, for each bank, the respective second network that is configured to be coupled to a respective one of a plurality of different power supply voltages for the plurality of banks.

* * * * *